(12) United States Patent
Kouchi

(10) Patent No.: US 9,627,340 B2
(45) Date of Patent: Apr. 18, 2017

(54) SEMICONDUCTOR DEVICE

(71) Applicant: Kabushiki Kaisha Toshiba, Minato-ku (JP)

(72) Inventor: Toshiyuki Kouchi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/847,544

(22) Filed: Sep. 8, 2015

(65) Prior Publication Data

US 2016/0351502 A1    Dec. 1, 2016

Related U.S. Application Data

(60) Provisional application No. 62/167,671, filed on May 28, 2015.

(51) Int. Cl.

| H03B 1/00 | (2006.01) |
|---|---|
| H03K 3/00 | (2006.01) |
| H01L 23/00 | (2006.01) |
| H01L 25/065 | (2006.01) |
| G11C 5/02 | (2006.01) |
| G11C 5/06 | (2006.01) |
| G11C 5/14 | (2006.01) |
| H01L 23/48 | (2006.01) |

(52) U.S. Cl.
CPC .............. *H01L 24/17* (2013.01); *G11C 5/025* (2013.01); *G11C 5/063* (2013.01); *G11C 5/147* (2013.01); *H01L 23/481* (2013.01); *H01L 25/0657* (2013.01); *H01L 2224/16146* (2013.01); *H01L 2224/16227* (2013.01); *H01L 2225/06513* (2013.01); *H01L 2225/06517* (2013.01); *H01L 2924/1434* (2013.01)

(58) Field of Classification Search
CPC . H03K 3/01; H03K 3/356; G05F 1/46; G11C 11/4085; H01L 25/0657
USPC .... 327/108–112, 427, 434, 437; 326/82, 83, 326/87; 365/230.01, 230.02, 230.03, 365/230.06, 185.11, 189.011, 51, 64
See application file for complete search history.

(56) References Cited

U.S. PATENT DOCUMENTS

| 2008/0298122 A1* | 12/2008 | Bedeschi ........... G11C 13/0004 365/163 |
|---|---|---|
| 2009/0091962 A1* | 4/2009 | Chung ..................... G11C 5/02 365/51 |
| 2009/0103345 A1* | 4/2009 | McLaren ................. G11C 5/02 365/64 |

(Continued)

FOREIGN PATENT DOCUMENTS

| JP | 2008-228167 | 9/2008 |
|---|---|---|
| JP | 2011-91708 | 5/2011 |
| JP | 2013-9212 | 1/2013 |

(Continued)

*Primary Examiner* — Lincoln Donovan
*Assistant Examiner* — Thomas Skibinski
(74) *Attorney, Agent, or Firm* — Oblon, McClelland, Maier & Neustadt, L.L.P.

(57) ABSTRACT

According to one embodiment, a semiconductor device includes a first semiconductor chip and a second semiconductor chip. The first semiconductor chip outputs a first signal by a first bus width and includes a first via which transfers the first signal. The second semiconductor chip receives, by the first bus width, the first signal transferred through the first via.

10 Claims, 8 Drawing Sheets

(56) References Cited

U.S. PATENT DOCUMENTS

2011/0095809 A1* 4/2011 Matsui ................ G11C 7/1048
327/427

FOREIGN PATENT DOCUMENTS

| JP | 5319773 | 10/2013 |
|----|---------|---------|
| WO | WO 2011/007642 A1 | 1/2011 |

* cited by examiner

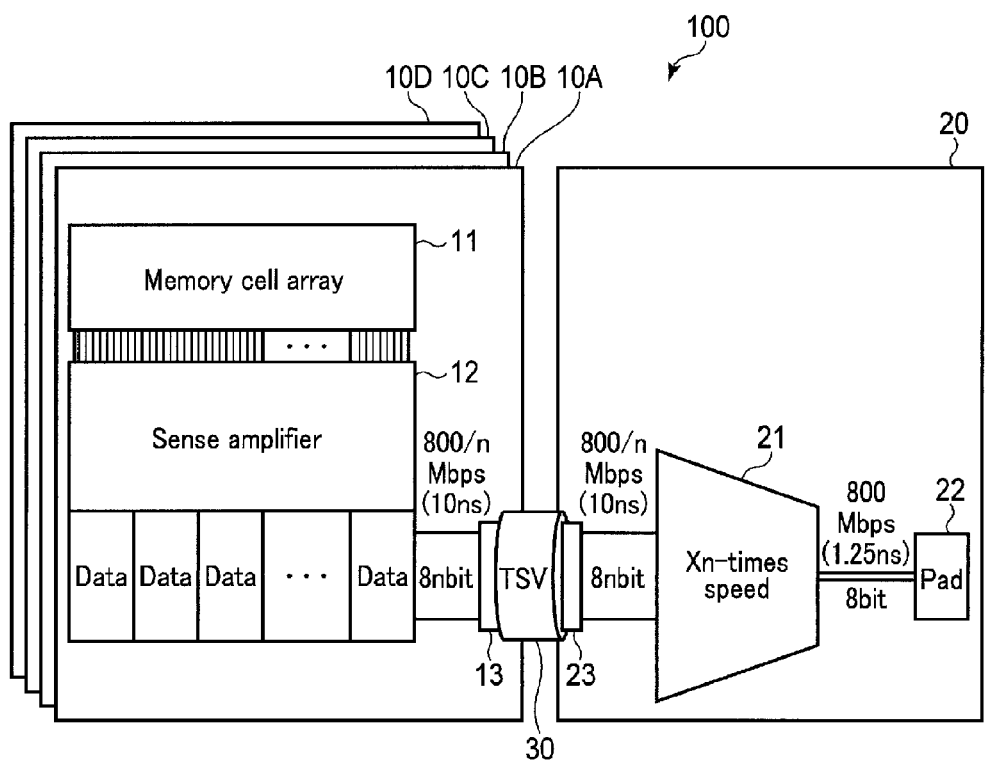
F I G. 1

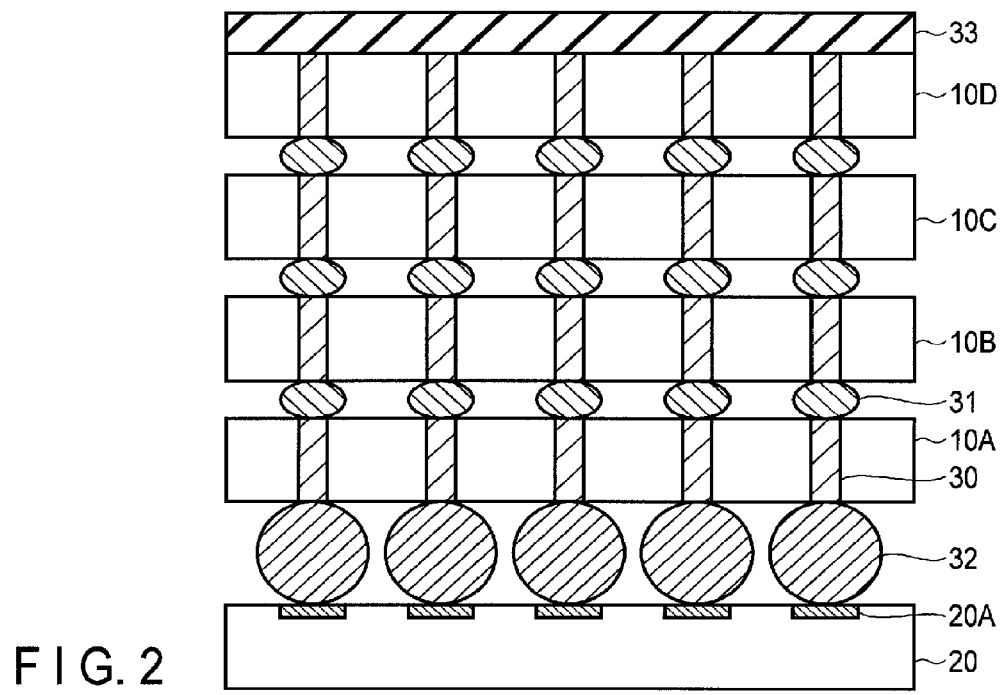
F I G. 2
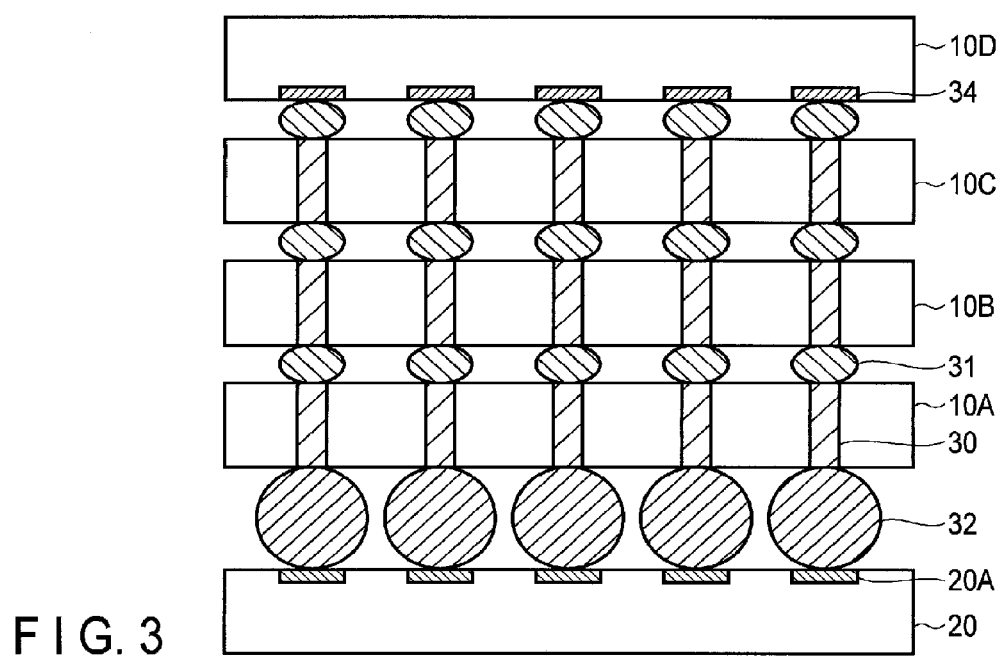
F I G. 3

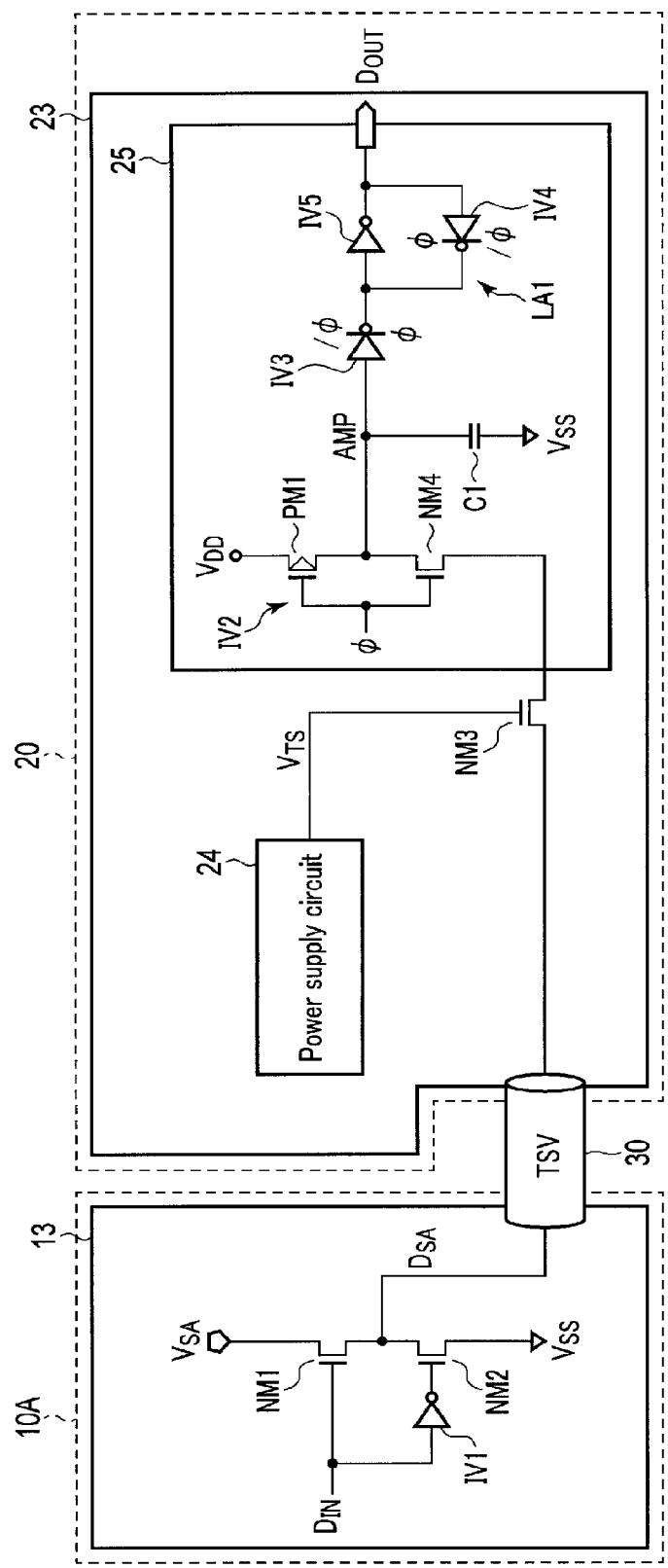
F I G. 4

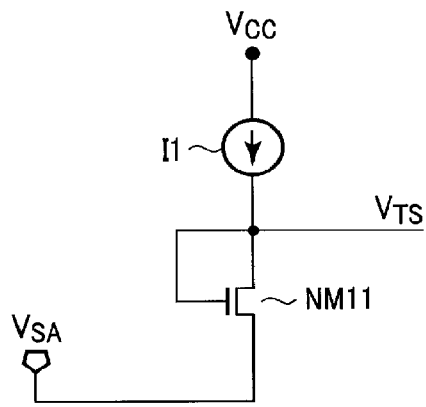
F I G. 5
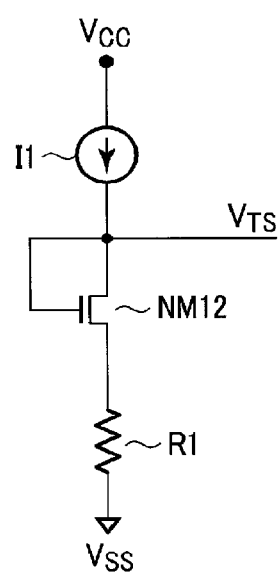
F I G. 6

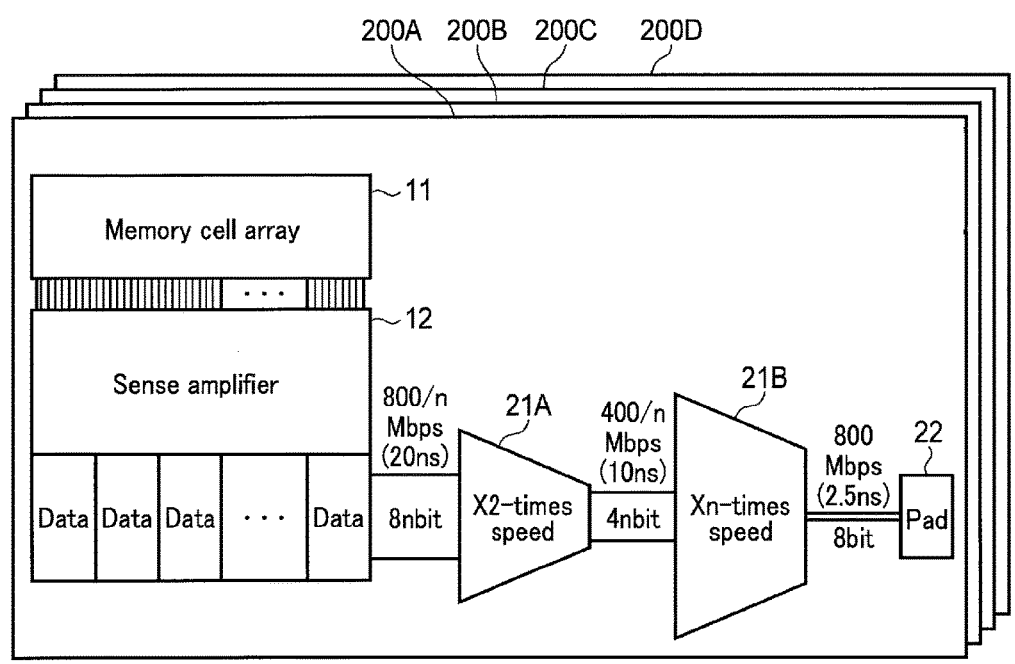
F I G. 11

SEMICONDUCTOR DEVICE

CROSS-REFERENCE TO RELATED APPLICATIONS

This application claims the benefit of U.S. Provisional Application No. 62/167,671, filed May 28, 2015, the entire contents of which are incorporated herein by reference.

FIELD

Embodiments described herein relate generally to a semiconductor device.

BACKGROUND

In recent years, in semiconductor devices, an increasingly large amount of data has been handled, and high-speed and stable data transfer have been required.

BRIEF DESCRIPTION OF THE DRAWING

FIG. 1 is a block diagram showing the configuration of a semiconductor device according to a first embodiment;

FIGS. 2 and 3 are sectional views of the semiconductor device according to the first embodiment;

FIG. 4 is a circuit diagram of a small-amplitude circuit in the semiconductor device according to the first embodiment;

FIG. 5 is a circuit diagram of a power supply circuit of a first example in the small-amplitude circuit;

FIG. 6 is a circuit diagram of an electric circuit of a second example in the small-amplitude circuit;

FIG. 11 is a block diagram showing the configuration of a semiconductor device according to a comparative example.

DETAILED DESCRIPTION

Figure 7:
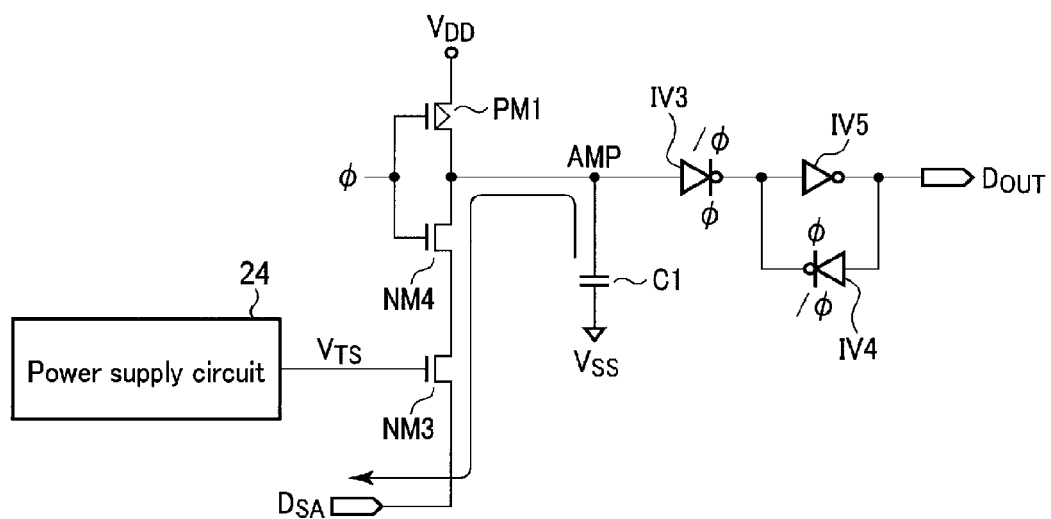
FIGS. 7 and 8 are circuit diagrams of the operation of the small-amplitude circuit.

Hereinafter, semiconductor devices according to embodiments will be described below with reference to the drawings. In the following explanation, components having the same functions and configurations are provided with the same reference signs. The embodiments described below illustrate apparatuses and methods that embody the technical concept of the embodiments, and do not specify the materials, shapes, structures, and locations of the components to those described below.

In general, according to one embodiment, a semiconductor device includes a first semiconductor chip and a second semiconductor chip. The first semiconductor chip outputs a first signal by a first bus width and includes a first via which transfers the first signal. The second semiconductor chip receives, by the first bus width, the first signal transferred through the first via.

1. First Embodiment

A semiconductor device according to a first embodiment is described.

1.1 Configuration of Semiconductor Device

The configuration of the semiconductor device according to the first embodiment is described with reference to FIG. 1.

A semiconductor device 100 according to the embodiment includes stacked memory chips (semiconductor chips) 10A, 10B, 10C, and 10D, and an interface chip (semiconductor chip) 20. Although four memory chips are stacked in the example shown here, five or more memory chips may be stacked.

A data signal (hereinafter, a small-amplitude signal) having a small-amplitude potential level is used for data transfer between each of the memory chips 10A to 10D and the interface chip 20. The small-amplitude potential level is, for example, 0.2 V to 0.4V. A small-amplitude circuit which transmits the small-amplitude signal is provided between each of the memory chips 10A to 10D and the interface chip 20. The small-amplitude circuit includes a drive circuit 13 and a receiving circuit 23. The small-amplitude circuit will be described in detail later.

Each of the memory chips 10A to 10D includes a memory cell array 11, a sense amplifier 12, the drive circuit 13, and a through silicon via (TSV) 30. Each of the memory chips 10A to 10D includes, for example, a NAND flash memory. The memory cell array 11 of each memory chip includes memory cells to store data. The sense amplifier 12 temporarily stores data read from the memory cell array 11, and outputs the stored data. The TSV 30 is a via which is provided in each of the memory chips 10A to 10D and which conducts from the upper surface to the lower surface of each memory chip. The structures of the memory chips 10A to 10D including the TSVs 30 and the interface chip 20 will be described in detail later.

The interface chip 20 includes a multiplexer 21, an output pad 22, and the receiving circuit 23. The multiplexer 21 selects and outputs one of the received data. The output pad 22 is a pad to output data to an external circuit.

A bus to transfer data (small-amplitude signal) is provided between each of the memory chips 10A to 10D and the interface chip 20. The bus between each of the memory chips and the interface chip 20 has, for example, a bus width of 8n (n is a natural number) bits. Each of the memory chips 10A to 10D includes the TSV 30 which outputs data by the 8n-bit bus width and which transfers data. The interface chip 20 receives, by the 8n-bit bus width, data transferred through the TSV 30.

The structures of the memory chips 10A to 10D and the interface chip 20 that are stacked are described below with reference to FIGS. 2 and 3. The sectional structures of the memory chips 10A to 10D and the interface chip 20 are shown in FIGS. 2 and 3.

As shown in FIG. 2, the memory chips 10A, 10B, 10C, and 10D are stacked on the interface chip 20 from the lower side (the side of the interface chip 20) in order. An insulating film 33 is provided on the memory chip 10D.

Each of the memory chips 10A to 10D is provided with the TSV 30. The TSV 30 electrically connects from the upper surface to the lower surface of each memory chip. A bump 31 is provided between the TSVs 30. The TSV 30 and the bump 31 electrically connect the memory chips 10A to 10D.

An interconnect layer 20A is provided on the upper surface of the interface chip 20. A bump 32 is provided between the interconnect layer 20A and the TSV 30 of the memory chip 10A.

Although the uppermost memory chip 10D includes the TSV 30 in the example shown in FIG. 2, the memory chip 10D may include no TSV 30 as shown in FIG. 3. The bump 31 is provided between an interconnect layer 34 on the lower surface of the memory chip 10D and the TSV 30 of the memory chip 10C. The structure is similar in other respects to the structure shown in FIG. 2.

For example, data (small-amplitude signal) output from the memory chip 10A is input to the interface chip 20 through the TSV 30 and the bump 32. Data output from the memory chip 10B is input to the interface chip 20 through the TSV 30 of the memory chip 10B, the bump 31, the TSV 30 of the memory chip 10A, and the bump 32.

1.2 Operation of Semiconductor Device

In the semiconductor device 100, data is transferred from each memory chip to the interface chip 20, for example, by the 8n-bit bus width.

First, data stored in the memory cell array 11 is read by the sense amplifier 12, and temporarily stored in the sense amplifier 12. The sense amplifier 12 outputs the temporarily stored data to the multiplexer 21 of the interface chip 20 through the drive circuit 13, the TSV 30, the bump, and the receiving circuit 23.

Specifically, the sense amplifier 12 uses, for example, the 8n-bit bus width to output data to the drive circuit 13 at a transmission speed of 800/n Mbps (a period of 10 ns). The drive circuit 13 outputs a small-amplitude signal to the TSV 30 in response to the received data. The output small-amplitude signal reaches the receiving circuit 23 of the interface chip 20. The receiving circuit 23 outputs data corresponding to the received small-amplitude signal to the multiplexer 21. In this way, the multiplexer 21 receives, by the 8n-bit bus width, data output from each memory chip. The transmission speed at this point is 800/n Mbps (a period of 10 ns). That is, data is transferred between the sense amplifier 12 of each memory chip and the multiplexer 21 of the interface chip 20 by the 8n-bit bus width and at a transmission speed of 800/n Mbps.

The multiplexer 21 then transfers the received data to the output pad 22 at an n-times speed. Specifically, the multiplexer 21 outputs data to the output pad 22, for example, by the 8n-bit bus width at a transmission speed of 800/n Mbps (a period of 1.25 ns).

1.3 Configuration of Small-Amplitude Circuit

The small-amplitude signal may be unilaterally transferred or bilaterally transferred between each of the memory chips and the interface chip 20. For example, when the small-amplitude signal is transferred from each of the memory chips 10A to 10D to the interface chip 20, each of the memory chips 10A to 10D includes the drive circuit 13, and the interface chip 20 includes the receiving circuit 23. In contrast, when the small-amplitude signal is transferred from the interface chip 20 to each of the memory chips 10A to 10D, the interface chip 20 includes the drive circuit 13, and each of the memory chips 10A to 10D includes the receiving circuit 23. When, for example, the small-amplitude signal is bilaterally transferred, each of the memory chips 10A to 10D includes the drive circuit 13 and the receiving circuit 23, and the interface chip 20 includes the receiving circuit 23 and the drive circuit 13.

In the example described here with reference to FIG. 4, the small-amplitude signal is transferred from the memory chip 10A to the interface chip 20. This example also holds true with the transfer of the small-amplitude signal from each of the memory chips 10B to 10D to the interface chip 20 and the transfer of the small-amplitude signal from the interface chip 20 to each of the memory chips 10A to 10D.

As described above, the small-amplitude circuit includes the drive circuit 13 and the receiving circuit 23. The memory chip 10A includes the drive circuit 13, and the interface chip 20 includes the receiving circuit 23. The TSV 30 is provided in the memory chip 10A, and electrically connects the drive circuit 13 and the receiving circuit 23.

The drive circuit 13 includes n-channel MOS field effect transistors (hereinafter, nMOS transistors) NM1 and NM2, and an inverter IV1. Data $D_{IN}$ is input to the gate of the nMOS transistor NM1, and input to the gate of the nMOS transistor NM2 through the inverter IV1. The source of the nMOS transistor NM1 is connected to the drain of the nMOS transistor NM2. A small-amplitude potential VSA is supplied to the drain of the nMOS transistor NM1. A reference potential such as a ground voltage VSS is supplied to the source of the nMOS transistor NM2. A connection node between the source of the nMOS transistor NM1 and the drain of the nMOS transistor NM2 is connected to the TSV 30. A small-amplitude signal DSA is output to the TSV 30 from the connection node.

The receiving circuit 23 includes an nMOS transistor NM3, a power supply circuit 24, and an amplifier circuit 25. The nMOS transistor NM3 is connected between the TSV 30 and the amplifier circuit 25, and constitutes a transfer gate. The nMOS transistor NM3 is switched to an on-state (transfer state) or an off-state (cut-off state) by a potential difference between an adjusting voltage VTS supplied to the gate thereof and the small-amplitude signal DSA input to the source thereof.

The power supply circuit 24 generates the adjusting voltage VTS which is supplied to the gate of the nMOS transistor NM3. The power supply circuit 24 will be described in detail later.

The amplifier circuit 25 includes an inverter IV2, a condenser C1, a clocked inverter IV3, and a latch circuit LA1. The inverter IV2 includes a p-channel MOS field effect transistor (hereinafter, pMOS transistor) PM1 and an nMOS transistor NM4. A signal ϕ is input to the input portion of the inverter IV2. The signal ϕ is input to the gates of the pMOS transistor PM1 and the nMOS transistor NM4. The drain of the nMOS transistor NM3 is connected to the source of the nMOS transistor NM4, and the small-amplitude signal DSA or the ground voltage VSS is input to the source of the nMOS transistor NM4. An internal power supply voltage VDD of, for example, 1.8 V or 2.0 V is supplied to the source of the pMOS transistor PM1.

The output portion of the inverter IV2 is connected to a first electrode of the condenser C1. A node between the output portion of the inverter IV2 and the first electrode of the condenser C1 is referred to as a node AMP. The ground voltage VSS is supplied to a second electrode of the condenser C1.

The output portion of the inverter IV2 is connected to the input portion of the clocked inverter IV3. The output portion of the clocked inverter IV3 is connected to the input portion of the latch circuit LA1. The latch circuit LA1 includes a clocked inverter IV4 and an inverter IV5. The output portion of the clocked inverter IV3 is input to the output portion of the clocked inverter IV4 and the input portion of the inverter IV5. The output portion of the inverter IV5 is connected to the input portion of the clocked inverter IV4. A phase inversion signal $\bar{\phi}$ of the signal ϕ is input to a first control terminal of the clocked inverter IV3, and the signal ϕ is input to a second control terminal thereof. The signal ϕ is input to a first control terminal of the clocked inverter IV4, and the signal /ϕ is input to a second control terminal thereof. Data DOUT is then output from the output portion of the latch circuit LA1.

Although the condenser C1 is connected to the node AMP in the example shown here, the condenser C1 can be eliminated when a required electric charge can be stored by parasitic capacitance existing in the node AMP.

1.3.1 Configuration of Power Supply Circuit

Two circuit examples of the power supply circuit 24 are described by the use of FIGS. 5 and 6.

A power supply circuit of a first example shown in FIG. 5 includes an nMOS transistor NM11 and an electric current source I1. For example, the power supply voltage VCC is supplied to the input portion of the electric current source I1 from the outside, and the drain and gate of the nMOS transistor NM11 are connected to the output portion of the electric current source I1. The small-amplitude potential VSA is supplied to the source of the nMOS transistor NM11.

In this first example, the adjusting voltage VTS is supplied to the gate of the nMOS transistor NM3 from the connection node between the output portion of the electric current source I1 and the drain and gate of the nMOS transistor NM11. The small-amplitude potential VSA is supplied to the source of the nMOS transistor NM11, so that the adjusting voltage VTS is a voltage higher than the small-amplitude potential VSA by a threshold voltage Vth of the nMOS transistor NM11. The nMOS transistor NM11 has the threshold voltage Vth which is the same as the threshold voltage Vth of the nMOS transistor NM3.

A power supply circuit of a second example shown in FIG. 6 includes an nMOS transistor NM12, a resistor R1, and an electric current source I1. For example, the power supply voltage VCC is supplied to the input portion of the electric current source I1 from the outside, and the drain and gate of the nMOS transistor NM12 are connected to the output portion of the electric current source I1. The ground voltage VSS is supplied to the source of the nMOS transistor NM12 through the resistor R1.

In this second example, the adjusting voltage VTS is supplied to the gate of the nMOS transistor NM3 from the connection node between the output portion of the electric current source I1 and the drain and gate of the nMOS transistor NM12. Here, the resistance value of the resistor R1 is set so that the source of the nMOS transistor NM12 may be the small-amplitude potential VSA. Thus, the adjusting voltage VTS is a voltage higher than the small-amplitude potential VSA by a threshold voltage Vth of the nMOS transistor NM12. The nMOS transistor NM12 has the threshold voltage Vth which is the same as the threshold voltage Vth of the nMOS transistor NM3.

1.4 Operation of Small-Amplitude Circuit

Next, the operation of the small-amplitude circuit shown in FIG. 4 is described.

In the drive circuit 13, data DIN is input to the gate of the nMOS transistor NM1 and the input portion of the inverter IV1. When data DIN is "H" (e.g. the power supply voltage VDD), the nMOS transistor NM1 is switched to the on-state, and the nMOS transistor NM2 is switched to the off-state. Thus, a signal at the "H" level as the small-amplitude signal DSA, that is, the small-amplitude potential VSA, is output to the TSV 30. In contrast, when data DIN is "L" (e.g. the ground voltage VSS), the nMOS transistor NM1 is switched to the off-state, and the nMOS transistor NM2 is switched to the on-state. Thus, a signal at the "L" level as the small-amplitude signal DSA, that is, the ground voltage VSS, is output to the TSV 30. The small-amplitude signal DSA output from the drive circuit 13 is transferred to the source of the nMOS transistor NM3 of the receiving circuit 23 through the TSV 30.

Next, the operation of the receiving circuit 23 of the small-amplitude circuit is described with reference to FIGS. 7, 8, and 9.

Figure 9:
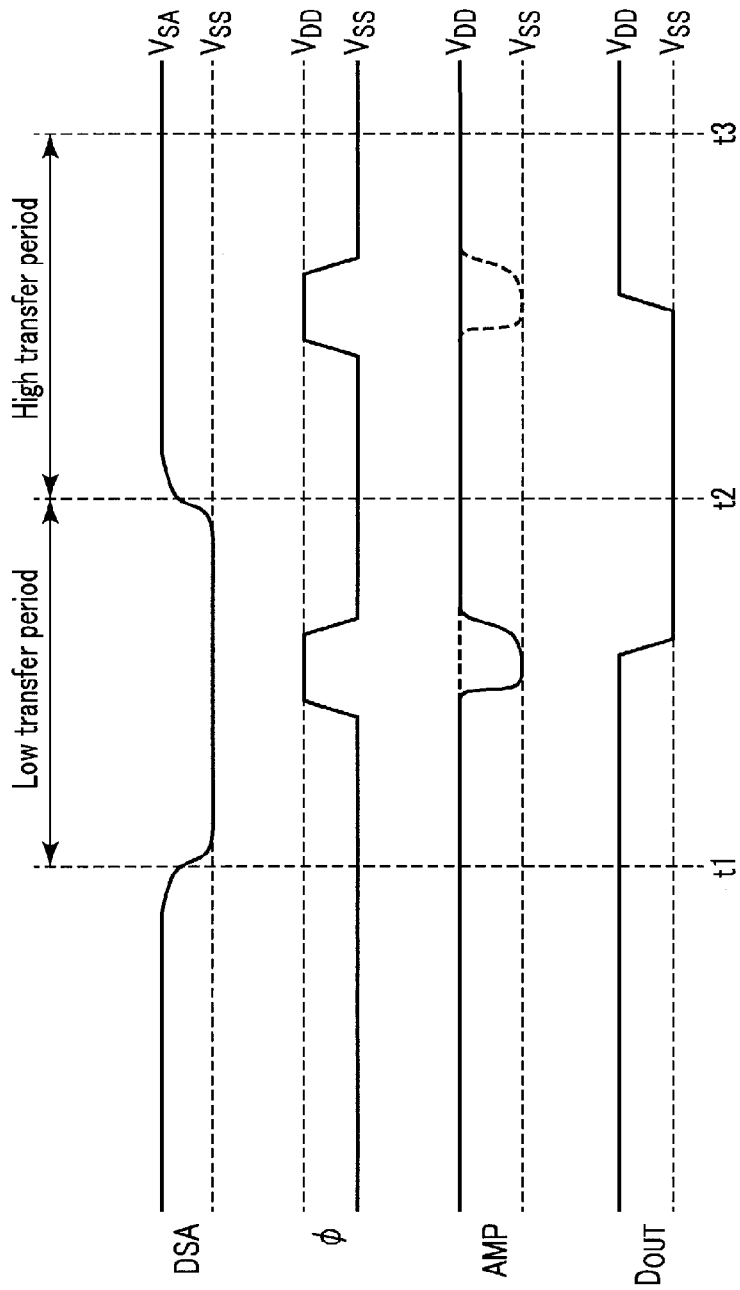
FIG. 9 is a timing chart showing the operation of the small-amplitude circuit.

First, as shown in FIG. 9, the signal ϕ is set to "L" to switch the pMOS transistor PM1 to the on-state and switch the nMOS transistor NM4 to the off-state. Moreover, the clocked inverter IV3 is switched to the off-state. Thus, the condenser C1 is charged to the "H" level, and the node AMP is pre-charged to the "H" level. In FIG. 9, a period in which the signal ϕ is "L" is a pre-charge period.

Next, FIG. 7 is used to describe a case (periods t1 to t2) in which "L" (the ground voltage VSS) is transferred to the source of the nMOS transistor NM3 as the small-amplitude signal DSA. The power supply circuit 24 supplies the gate of the nMOS transistor NM3 with the adjusting voltage VTS in which the small-amplitude potential VSA and the threshold voltage Vth of the nMOS transistor NM3 are added together. Thus, a gate-source voltage of the nMOS transistor NM3 becomes "VSA+Vth", and the nMOS transistor NM3 is switched to the on-state.

Here, if the signal ϕ is switched to "H", the pMOS transistor PM1 is switched to the off-state, the nMOS transistor NM4 is switched to the on-state, and the clocked inverter IV3 is switched to the on-state. Therefore, the voltage that has charged the condenser C1 is discharged through the nMOS transistors NM4 and NM3. Thus, the potential of the node AMP becomes "L", and the potential "L" of the node AMP is latched by the latch circuit LA1 through the clocked inverter IV3. As a result, "L" (the ground voltage VSS) is output from the latch circuit LA1 as data DOUT.

Figure 8:
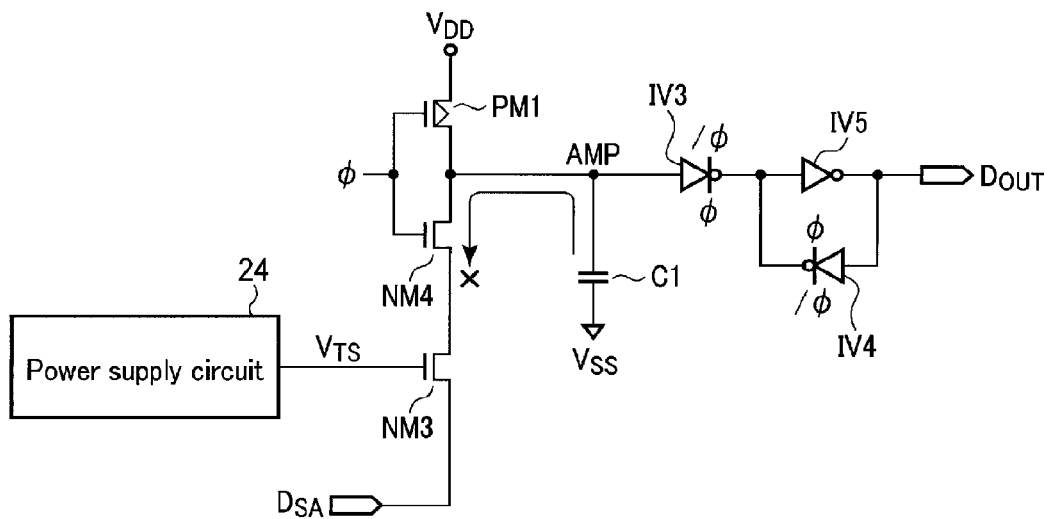

Next, FIG. 8 is used to describe a case (periods t2 to t3) in which "H" (the small-amplitude potential VSA) is transferred to the source of the nMOS transistor NM3 as the small-amplitude signal DSA. The power supply circuit 24 similarly supplies the gate of the nMOS transistor NM3 with the adjusting voltage VTS in which the small-amplitude potential VSA and the threshold voltage Vth of the nMOS transistor NM3 are added together. Thus, the gate-source voltage of the nMOS transistor NM3 becomes the threshold voltage Vth, and the nMOS transistor NM3 is switched to the off-state.

Here, if the signal ϕ is switched to "H", the pMOS transistor PM1 is switched to the off-state, the nMOS transistor NM4 is switched to the on-state, and the clocked inverter IV3 is switched to the on-state. However, the nMOS transistor NM3 is in the off-state, so that the voltage that has charged the condenser C1 is blocked by the nMOS transistor NM3. Thus, the voltage of the node AMP maintains "H", and the potential "H" of the node AMP is latched by the latch circuit LA1 through the inverter IV3. As a result, "H" (the power supply voltage VDD) is output from the latch circuit LA1 as data DOUT. When the gate-source voltage of the nMOS transistor NM3 is the threshold voltage Vth, a small electric current starts to flow, so that this state may be considered to be the off-state.

As described above, when the small-amplitude signal DSA is "L", the nMOS transistor NM3 is switched to the on-state, "H" that has pre-charged the node AMP is discharged, and the node AMP becomes "L". Thus, the latch circuit LA1 holds and outputs "L".

When the small-amplitude signal DSA is "H", the nMOS transistor NM3 is switched to the off-state, and "H" that has pre-charged the node AMP, is maintained. Thus, the latch circuit LA1 holds and outputs "H".

1.5 Manufacturing Processes of Drive Circuit and Receiving Circuit

As described above, for example, each of the memory chips 10A to 10D includes the drive circuit 13, and the interface chip 20 includes the receiving circuit 23. Each of the memory chips 10A to 10D includes, for example, a NAND flash memory, and is therefore manufactured by a process of forming a NAND flash memory (hereinafter referred to as a NAND process). In contrast, the interface chip 20 is manufactured by a process of forming a CMOS transistor (hereinafter, a CMOS process or a logic process).

The nMOS transistor (transfer gate) NM3 provided in the receiving circuit 23 and the nMOS transistor NM4 of the power supply circuit 24 are manufactured from the same CMOS process. Thus, the nMOS transistor NM3 and the nMOS transistor NM4 are easily formed to have the same transistor characteristics (e.g. threshold voltage). Therefore, the power supply circuit 24 can easily generate the adjusting voltage VTS having the voltage "VSA+Vth".

2. Second Embodiment

In the example shown in the first embodiment, the small-amplitude signal DSA output from the drive circuit 13 is transferred to the receiving circuit 23 by the use of the TSV 30. The small-amplitude circuit described above is also applicable to a case in which a transmission line including no TSV 30 is used. In the example shown in the second embodiment, the small-amplitude signal DSA is transferred to the receiving circuit 23 by the use of a transmission line other than the TSV 30.

2.1 Configuration of Small-Amplitude Circuit

Figure 10:
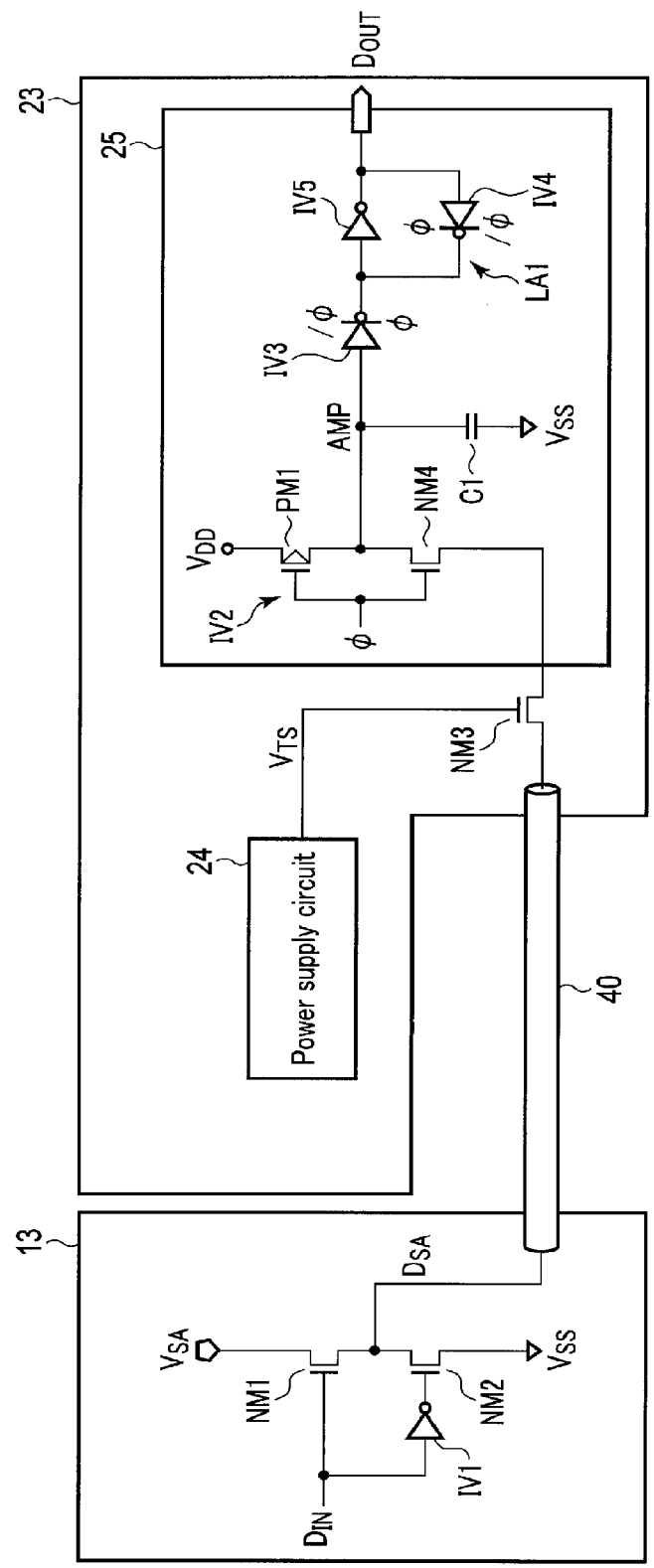
FIG. 10 is a circuit diagram of a small-amplitude circuit in a semiconductor device according to a second embodiment.

The configuration of the small-amplitude circuit in a semiconductor device according to the second embodiment is described with reference to FIG. 10. The small-amplitude circuit includes the drive circuit 13 and the receiving circuit 23. A transmission line 40 is connected between the drive circuit 13 and the receiving circuit 23.

The semiconductor device according to the second embodiment includes, for example, the following form.

The memory chip 10A includes the drive circuit 13, and the interface chip 20 includes the receiving circuit 23. The transmission line 40 is, for example, a bump or a bonding wire provided between the memory chip 10A and the interface chip 20.

The drive circuit 13 and the receiving circuit 23 may be provided in the same semiconductor chip, and the transmission line 40 may be an interconnect layer formed in the semiconductor chip.

The configuration and operation according to the second embodiment are similar in other respects to those according to the first embodiment, and are therefore not described.

3. Effects of First and Second Embodiments

In the first embodiment, the TSV 30 is used for data transfer between each of the memory chips 10A to 10D and the interface chip 20, and data is transferred by the same bus width between each of the memory chips 10A to 10D and the TSV 30 and between the TSV 30 and the interface chip 20, so that the circuit surface areas of the memory chips 10A to 10D can be reduced.

Advantageous effects of the first embodiment are described below in detail by the use of a comparative example shown in FIG. 11. In the comparative example, semiconductor devices 200A, 200B, 200C, and 200D are stacked. Each of the semiconductor devices 200A to 200D includes the memory cell array 11, the sense amplifier 12, multiplexers 21A and 21B, and the input/output pad 22 on a semiconductor chip. The sense amplifier 12 uses, for example, an 8n-bit bus width to output data to the multiplexer 21A. The multiplexer 21A selects the received data, and outputs data to the multiplexer 21B using a 4n-bit bus width. Furthermore, the multiplexer 21B selects the received data, and outputs data to the output pad 22 using an 8-bit bus width. However, in these semiconductor devices 200A to 200D, the multiplexer and the output pad are disposed in each of the semiconductor devices 200A to 200D, and the TSV is not used for the connection between the chips, so that the surface areas for arrangement of the multiplexer and the output pad and connection between chips increase.

In contrast, according to the first embodiment, the multiplexer and the output pad are disposed in the interface chip 20 and are shared by the memory chips 10A to 10D, so that the circuit surface areas of the memory chips 10A to 10D can be reduced.

In the first and second embodiments, the small-amplitude signal can be transferred as a single-phase signal, so that the number of TSVs or the number of signal lines necessary to transfer the small-amplitude signal can be reduced. Thus, the circuit surface areas of the memory chips 10A to 10D can be reduced.

For example, there is a known method of stably transferring the small-amplitude signal by using two signal lines to transfer data by a one-bit bus width, and transferring a complementary signal (or a differential signal) to these signal lines. However, in this case, because the required number of signal lines is twice the number of bits of the bus width, it is not suitable to increase the bits of the bus width. In the case of a memory chip having a TSV, the TSV is used as a signal line for passing data, so that the surface area of the memory chip increases if the number of TSVs used is larger.

In contrast, according to the first and second embodiments, the small-amplitude signal can be transferred as a single-phase rather than a complementary signal; in other words, only one TSV or one signal line has to be prepared for the one-bit bus width, so that the number of TSVs or the number of signal lines necessary to transfer the small-amplitude signal can be reduced. Thus, the circuit surface areas of the memory chips can be reduced. Moreover, it is possible to rapidly and stably transfer the small-amplitude signal by using the small-amplitude circuit shown in FIGS. 4 and 10.

MODIFICATIONS, ETC.

Although the memory chip includes a NAND flash memory in the first and second embodiments, the memory chip is not limited to this, and is applicable to other nonvolatile memories or volatile memories. Moreover, the memory chip is also applicable to various semiconductor integrated circuits.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor chip which outputs a first signal by a first bus width and which includes a first via which transfers the first signal; and
a second semiconductor chip which receives, by the first bus width, the first signal transferred through the first via, wherein
the first semiconductor chip comprises a drive circuit which drives the first signal,
the second semiconductor chip comprises a transfer circuit which takes one of a conduction state and a cut-off state in accordance with the first signal, and an amplifier circuit which amplifies the first signal when the transfer circuit is in the cut-off state,
the first signal has one of a first voltage and a reference voltage, and the transfer circuit includes a first transistor,
the second semiconductor chip further comprises a power supply circuit which supplies the gate of the first transistor with a voltage in which the first voltage and the threshold voltage of the first transistor are added together,
the amplifier circuit comprises an inverter, a condenser, and a latch circuit, and
the drain of the first transistor is electrically connected to a power supply end of the inverter, and the output portion of the inverter is electrically connected to the condenser and the latch circuit.

2. The semiconductor device according to claim 1, wherein the first via is electrically connected from the upper surface to the lower surface of the first semiconductor chip.

3. The semiconductor device according to claim 2, further comprising a third semiconductor chip which outputs a second signal by the first bus width and which includes a second via which transfers the second signal, wherein
the third semiconductor chip is disposed on the first semiconductor chip, and
the second semiconductor chip receives, by the first bus width, the second signal transferred through the first via and the second via.

4. The semiconductor device according to claim 1, wherein
the power supply circuit comprises a second transistor having the same threshold voltage as the threshold voltage of the first transistor, and an electric current source, and
the electric current source is electrically connected to the gate and drain of the second transistor, and the first voltage is supplied to the source of the second transistor.

5. The semiconductor device according to claim 1, wherein
the power supply circuit comprises a second transistor having the same threshold voltage as the threshold voltage of the first transistor, and an electric current source, and
the electric current source is electrically connected to the gate and drain of the second transistor, and the reference voltage is supplied to the source of the second transistor through a resistance.

6. The semiconductor device according to claim 1, wherein
the drive circuit comprises a second transistor, a third transistor, and an inverter, and
the output portion of the inverter is electrically connected to gate of the third transistor, and the source of the second transistor is electrically connected to the drain of the third transistor and the first via.

7. The semiconductor device according to claim 1, wherein the first semiconductor chip comprises a memory cell to store data, and a sense amplifier which reads data from the memory cell and outputs data.

8. The semiconductor device according to claim 1, wherein
the second semiconductor chip comprises a multiplexer which receives the first signal, and
the multiplexer outputs the first signal by a bus width smaller than the first bus width and at a transmission speed higher than a transmission speed of reception.

9. The semiconductor device according to claim 1, wherein
the first semiconductor chip comprises a first circuit which outputs the first signal, and the second semiconductor chip comprises a second circuit which receives the first signal, and
a transistor included in the first circuit has a threshold voltage different from the threshold voltage of a transistor included in the second circuit.

10. The semiconductor device according to claim 1, wherein the first voltage of the first signal is lower than a power supply voltage.

* * * * *